(12) United States Patent
Bernstein et al.

(10) Patent No.: US 7,454,642 B2
(45) Date of Patent: Nov. 18, 2008

(54) METHOD AND ARCHITECTURE FOR POWER MANAGEMENT OF AN ELECTRONIC DEVICE

(75) Inventors: Kerry Bernstein, Underhill, VT (US); Kenneth Joseph Goodnow, Essex, VT (US); Clarence Rosser Ogilvie, Huntington, VT (US); Keith Robert Williams, Essex Junction, VT (US); Sebastian Theodore Ventrone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 312 days.

(21) Appl. No.: 11/278,262

(22) Filed: Mar. 31, 2006

(65) Prior Publication Data

US 2007/0228830 A1    Oct. 4, 2007

(51) Int. Cl.
*G06F 1/26* (2006.01)
*G06F 1/32* (2006.01)

(52) U.S. Cl. ........................................ 713/324; 713/320

(58) Field of Classification Search .......... 713/300–340
See application file for complete search history.

(56) References Cited

U.S. PATENT DOCUMENTS

| 6,861,739 | B1 * | 3/2005 | Bhavnagarwala et al. | ... 257/691 |
| 2005/0213267 | A1 * | 9/2005 | Azrai et al. | .................... 361/15 |
| 2005/0213280 | A1 * | 9/2005 | Azrai et al. | ................. 361/271 |
| 2006/0006929 | A1 * | 1/2006 | Caplan et al. | ................ 327/546 |
| 2006/0123365 | A1 * | 6/2006 | Hoberman et al. | ............. 716/4 |
| 2006/0208574 | A1 * | 9/2006 | Lasseter et al. | ................ 307/69 |

* cited by examiner

*Primary Examiner*—Dennis M Butler
(74) *Attorney, Agent, or Firm*—Schmeiser, Olsen & Watts; Michael J. LeStrange

(57) ABSTRACT

A method of reducing static power consumption in a low power electronic device. The electronic device including one or more power islands, each power island including: a local storage capacitor coupling a local power grid to a local ground grid; and a functional circuit connected between the local power grid and the local ground grid; a global storage capacitor coupling a global power grid to a global ground grid, each local ground grid connected to the global ground grid; one or more switches, each switch selectively connecting the global power grid to a single and different corresponding local power grid; and a power dispatch unit adapted to open and close the one or more switches.

17 Claims, 5 Drawing Sheets

METHOD AND ARCHITECTURE FOR POWER MANAGEMENT OF AN ELECTRONIC DEVICE

FIELD OF THE INVENTION

The present invention relates to the field of integrated circuits; more specifically, it relates to method and architecture for power management of an integrated circuit device.

BACKGROUND OF THE INVENTION

As the dimensions of integrated circuit devices decrease and the performance increases a larger and larger proportion of the power consumed is lost through such mechanisms as junction leakage, sub-threshold leakage, gate dielectric tunneling leakage, avalanche leakage and drain induced barrier lowering leakage. This non-productive power consumption becomes extremely important in applications where the amount of power available is limited. Therefore, there is a need for a method and electronic device architecture that reduces non-productive power consumption.

SUMMARY OF THE INVENTION

A first aspect of the present invention is an electronic device, comprising: one or more power islands, each power island including: a local storage capacitor coupling a local power grid to a local ground grid; and a functional circuit connected between the local power grid and the local ground grid; a global storage capacitor coupling a global power grid to a global ground grid, each local ground grid connected to the global ground grid; one or more switches, each switch selectively connecting the global power grid to a single and different corresponding local power grid; and a power dispatch unit adapted to open and close the one or more said switches.

A second aspect of the present invention is method, comprising: providing one or more power islands, each power island including: a local storage capacitor coupling a local power grid to a local ground grid; and a functional circuit connected between the local power grid and the local ground grid; providing a global storage capacitor coupling a global power grid to a global ground grid, each local ground grid connected to the global ground grid; providing one or more switches, each switch selectively connecting the global power grid to a single and different corresponding local power grid; and a power dispatch unit adapted to open and close the one or more said switches.

A third aspect of the present invention is a method, comprising: receiving one or more requests for power, each of the one or more requests for power from a single power island of one or more power islands, each power island including a local storage capacitor coupling a local power grid to a local ground grid and a functional circuit connected between the local power grid and the local ground grid; and dispatching power originally stored in a global storage capacitor to one or more of the power islands that have requested power by selectively connecting a global power grid to one or more of the local power grids, the global storage capacitor coupling a global power grid to a global ground grid, each local ground grid connected to the global ground grid.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
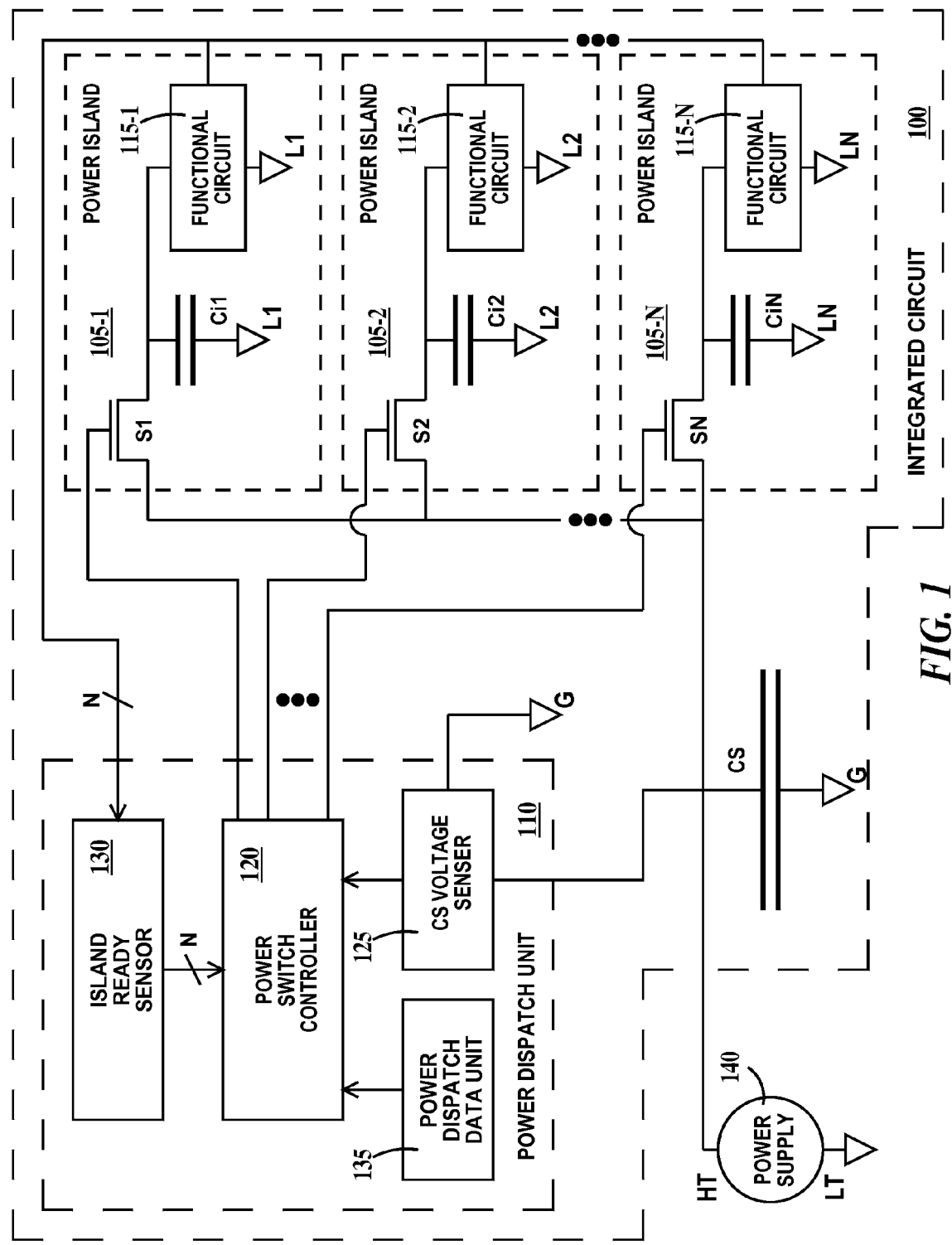
FIG. 1 is a schematic circuit diagram of an integrated circuit device according to embodiments of the present invention.

FIG. 1 is a schematic circuit diagram of an integrated circuit device according to embodiments of the present invention. In FIG. 1, an integrated circuit 100 includes a multiplicity of power islands 105-1, 105-2 through 105-N as well as a power dispatch unit 110 and a global storage capacitor CS. Each power island 105A, 105B through 105N includes a corresponding functional circuit 115-1, 115-2 through 115-N, a corresponding local storage capacitor Ci1, Ci2 through CiN and a corresponding power switch S1, S2 through SN. While power switches S1, S2 through SN are illustrated as n-channel, field effect transistors (NFETs) any switching device or circuit known to the art may be substituted for power switches S1, S2 through SN. Power dispatch unit 110 includes a power switch controller 120, a global storage capacitor voltage sensor 125, a power island ready for power sensor 130 and a power dispatch data unit 135. Alternatively, power switches S1, S2 through SN may be physically located in power dispatch unit 110.

A first plate of global storage capacitor CS is connectable to a high voltage terminal (HT) of a power supply 140 and connected to a global storage capacitor voltage sensor 125 and a first pole (NFET drain) of each of power switches S1, S2 through SN. A second plate of global storage capacitor CS is connected to a global ground grid (G) of integrated circuit 100. The global ground grid is common to the low voltage terminal (LT) of power supply 140.

For each power island 105-1, 105-2 through 105-N, a first plate of each local storage capacitor Ci1, Ci2 through CiN contacts a second pole (NFET source) of each of power switches S1, S2 through SN and the local power grid (L1, L2 through LN) of each corresponding functional circuit 115-1, 115-2 through 115-N. For each power island 105-1, 105-2 through 105-N, a second plate of each local storage capacitor Ci1, Ci2 through CiN is common to a local ground grid of each of the power islands. The local ground grids are common to the global ground grid. Each functional circuit 115-1, 115-2 through 115-N is connected to a power island "ready for power" sensor circuit 130 as described infra in reference to FIGS. 2A and 2B.

Power island "ready for power" sensor circuit 130, global storage capacitor voltage sensor 125 and power dispatch data unit 135 are coupled to power switch controller 120. Power switch controller 120 executes the "throw" on (NFET gating) of each of power switches S1, S2 through SN. Power dispatch circuit 110 may be implemented as circuits (in which case power dispatch data unit 135 may be implemented as a register or read only memory (ROM)) or as a combination of circuits and software (in which case power dispatch data unit 135 may be implemented as a data/algorithm file and power switch controller 120 as a combination of software and hardware). Power dispatch unit draws its power from global storage capacitor CS when power supply 140 is not supplying power.

In operation, when power supply 140 is supplying power, the potential across global storage capacitor CS will rise to a given supply voltage. When any of power switches S1, S2 through SN are closed (a logical one on the NFET gate), corresponding local storage capacitors Ci1, Ci2 through CiN will charge, either directly from power supply 140 or via global storage capacitor CS. As long as power supply 140 is supplying power, global storage capacitor CS and local storage capacitors Ci1, Ci2 through CiN will charge to the given supply voltage and all functional circuits 115-1, 115-2 through 115-N can operate normally and all power switches S1, S2 through SN can be closed. However, if power supply 140 stops supplying power, then the power switches are opened (a logical zero on the NFET gate), and each functional circuit is supplied with power from its respective local storage capacitor. While power supply 140 is not supplying power, power switch controller 120 will open and close power switches S1, S2 through SN in response to "requests" for power from corresponding functional circuits 155-1, 115-2 through 115-N. In one example, the "request" for power is a signal that data has been latched into an input latch of the functional circuit. Requests for power occur when the local storage capacitor has insufficient charge to operate the functional circuit and the functional circuit has a need to process data. Alternatively, requests for power occur when the functional circuit has a need to process, irregardless of the charge state of the local storage capacitor since its voltage will have been reduced the last time the functional circuit processed data.

Global storage capacitor voltage sensor circuit 125 senses the charge (voltage level) on global storage capacitor CS. This sense is propagated to power switch controller 120 so the power switch controller can determine which power switch (among S1, S2 through SN) to close in response to power requests from power islands 115-1, 115-2 through 115-N, given the data from power dispatch data unit 135.

There is no requirement that global storage capacitor CS be fully charged. In order to minimize leakage loss, in one example, each local storage capacitor Ci1, Ci2 through CiN is sized to supply one (worst case power path) operational cycle of its corresponding functional logic circuit 115-1, 115-2 through 115N. In one example global storage capacitor CS is sized to have a charge storage capacity of about 10 times that of the largest local storage capacitor Ci1, Ci2 through CiN. When the charges in local storage capacitors are consumed (and switches S1 . . . SN are opened) the power island is de-powered and there is no power loss due to the various leakage mechanisms described supra.

In one example, integrated circuit 100 is an integrated circuit chip. In another example, integrated circuit 100 is a less than whole portion of an integrated circuit chip. In a third example, global storage capacitor CS is located off-chip.

Figure 2A:
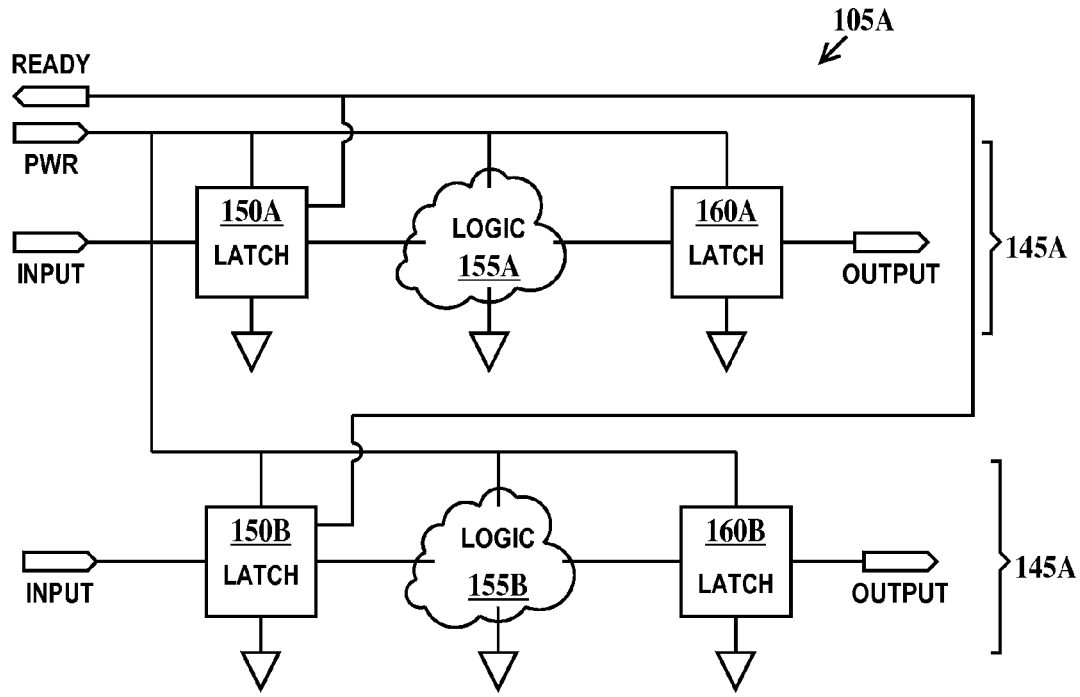
FIGS. 2A and 2B are exemplary schematic circuit diagram of the functional circuits of FIG. 1.
Figure 2B:
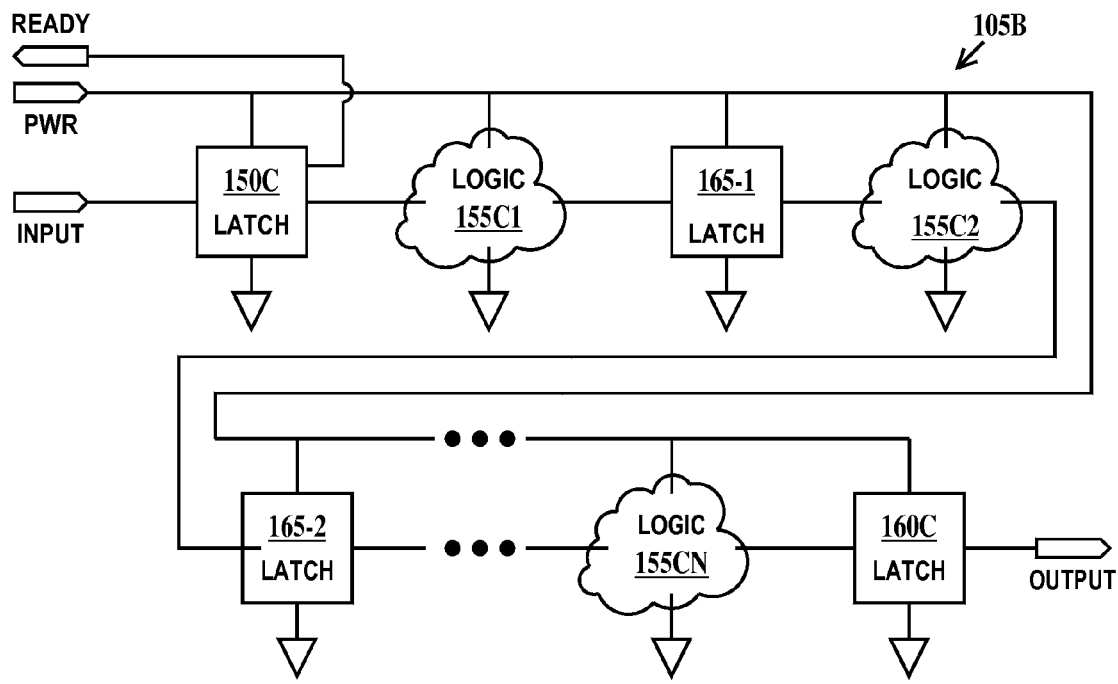

FIGS. 2A and 2B are exemplary schematic circuit diagram of the functional circuits of FIG. 1. In FIG. 2A, a functional circuit 105A (representing one or more of functional circuits 105-1, 105-2 through 105-N of FIG. 1) includes a first circuit comprising a first input latch 150A coupled to a first combinational logic 155A whose output is coupled to a first output latch 160A and a second circuit 145B comprising a second input latch 150B coupled to a second combinational logic 155B, whose output is coupled to a second output latch 160B. Each of first and second circuits 145A and 145B has its own input (the input latch) and output (the output latch), but both first and second circuits are connected to the same power grid (i.e. to the same local storage capacitor as depicted in FIG. 1). Each first latch 150A and 150B generates a READY signal when data is either present at the inputs to the latches or has been captured by the latches. Power to generate the READY signal is either supplied by the local storage capacitor or by the respective island's "ready for power" sensor circuit 130 (see FIG. 1). While two parallel circuits are illustrated in FIG. 2A, there may be one circuit or a number of circuits greater than two.

FIG. 2B is similar to FIG. 2A except a single pipe-lined circuit is illustrated. In FIG. 2B, In FIG. 2A, a functional circuit 105B (representing one or more of functional circuits 105-1, 105-2 through 105-N of FIG. 1) includes in series: an input, an input latch 150C, a first combinational logic 155C1 and first intermediate latch 165-1, second combinational logic 155C2 and second intermediate latch 165-2 through last combinational logic 155CN, an output latch 160C and an output. Only input latch 150C generates the READY signal.

While logic circuits are illustrated in FIGS. 2A and 2B, the invention is not limited to latched logic circuits, but can be applied to other types of logic circuits as well as to non-combinatorial functional circuits such as memory and non-volatile memory. This may be done for this class of circuits as long as provision is made to sustain minimum voltages needed to maintain bistable circuit states.

Figure 3:
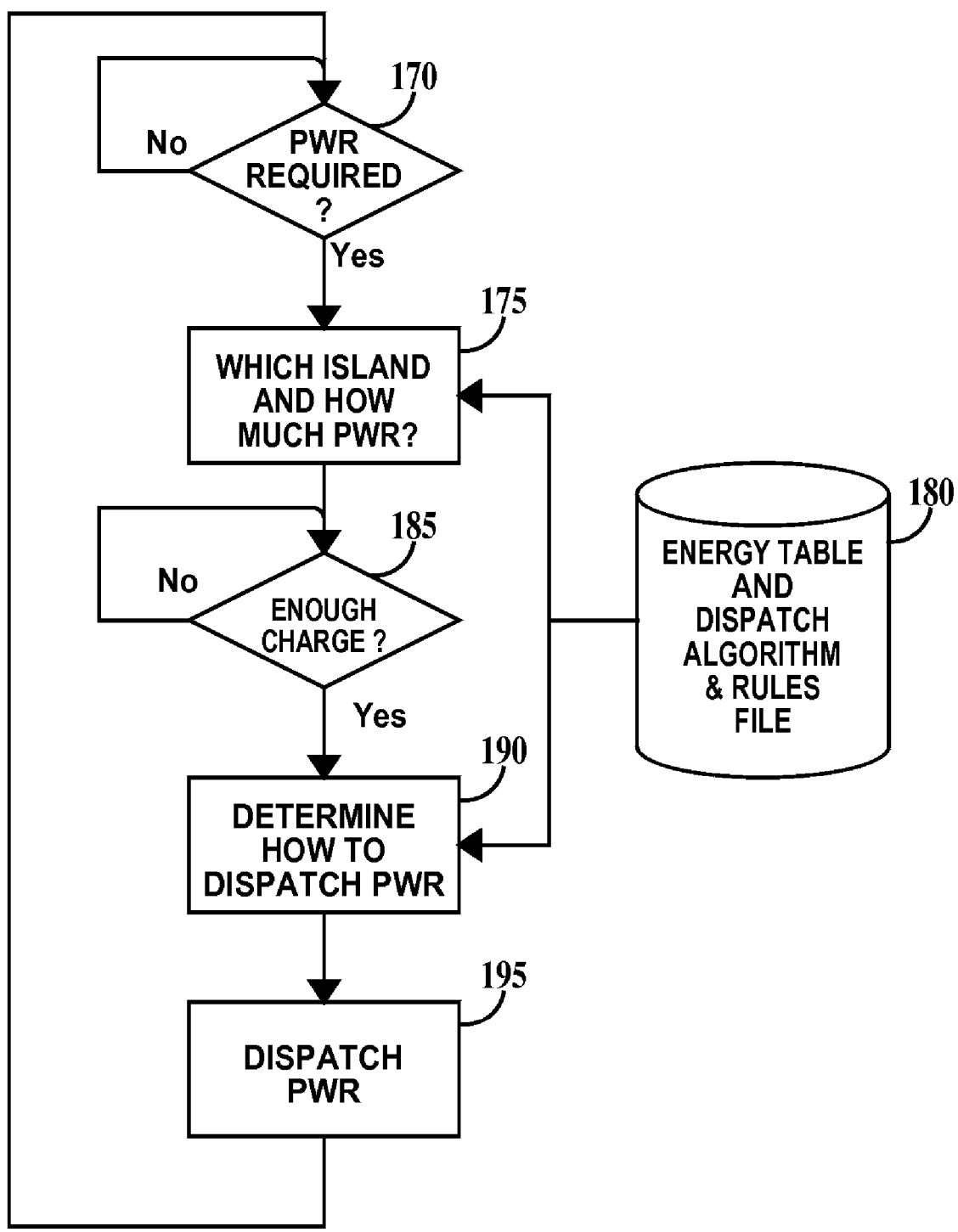
FIG. 3 is a flowchart of the methodology of the embodiments of the present invention.

FIG. 3 is a flowchart of the methodology of the embodiments of the present invention. In step 170, it is determined if any of the power islands is requesting power. If not, step 170 continues monitoring requests for power until a request is received. When a request for power is received, in step 175 it is determined which power islands are requesting power and how much power is required for each power island requesting power. The power requirement is determined from energy table/dispatch algorithm/rules file 180. In one example, energy table and dispatch algorithm file 180 is power dispatch power unit 135 of FIG. 1. Next, step 185, determines if enough charge remains in the global storage capacitor to satisfy at least one of the requesting power islands. The determination of which power islands to supply and in what sequence is determined from a dispatch algorithm and rules portion of energy table and dispatch algorithm file 180.

Examples of rules and algorithms are given in TABLE I. TABLE I offers exemplary rules and algorithms, which may be applied.

TABLE I

| EXAMPLE | RULE/ALGORITHM |
|---|---|
| 1 | Dispatch power to power islands in the order received. |
| 2 | Simultaneously dispatch power to as many power islands that are requesting power (within a time window) as possible, without exceeding available power |
| 3 | If there is not enough power to satisfy all power requests, dispatch power to power islands in the order received. |
| 4 | If there is not enough power to satisfy all power requests, simultaneously dispatch power to the combination of power islands that are requesting power (within a time window) that results in the maximum number of power islands being supplied. |
| 5 | If there is not enough power to satisfy all power requests, simultaneously dispatch power to the combination of power islands that are requesting power (within a time window) that results in the maximum drawn down of power from the global storage capacitor. |

TABLE I-continued

| EXAMPLE | RULE/ALGORITHM |
|---|---|
| 6 | If there is not enough power to satisfy all power requests, simultaneously dispatch power to the combination of power islands that are requesting power (within a time window) that results in least amount of wasted power. |
| 7 | If a particular power island has been requesting power for longer than a preset time period, override other rules and algorithms and supply power to that power island (if there is enough power available). |

Next, in step 195, power is dispatched and the method loops back to step 170.

It can be shown (see infra), that the most efficient use power results when power is dispatched when requested and if two or more power islands simultaneously request power then simultaneously supplying power to all the requesting power islands. A simultaneous request for power may be considered requests received within a preset time duration.

The energy that will be drawn by a power island $(E_i)=0.5*C_iV_i^2$ where $C_i$ is the capacitance of the local storage capacitor and $V_i$ is the voltage across the local storage capacitor. The energy that will be stored on the global storage capacitor $(E_s)=0.5*C_sV_s^2$ where $C_s$ is the capacitance of the global storage capacitor and $V_s$ is the across the global storage capacitor. The energy that will be stored on both capacitors (after the switch is closed and assuming no power from the power supply) $(E_T)=0.5*C_s^2V_s^2/(C_s+C_i)$ and the energy that will be lost $(E_L)=0.5*C_sV_s^2[C_i/(C_s+C_i)]$. The energy $(E_L)$ lost is lost to heat and electromagnetic radiation (EMR) in the transmission line between the global and local storage capacitors. The energy consumed by the functional circuit $(E_{USED})=0.5*C_sV_s^2[1-[C_s/(C_s+C_i)]^2]$. And the energy left on the storage capacitor $(E_{LEFT})=0.5*C_i\{[C_sV_s/[C_s/(C_s+C_i)]]^2-V_i^2\}$.

Using the equations above, various scenarios can be examined. Four examples will be offered. In a first scenario, Cs=10 micro-farad and Ci=1 micro-farad, Vs=1 volt and Vi=0 volt) and $E_T$=5 joule before the switch is closed. After the switch is closed Vs=Vi=0.90909 volt, $E_{USED}$=4.132+0.4132=4.545 joules and $E_{LOST}$ ($E_T-E_{USED}$)=5−4.4545=0.4545 joules. In a second scenario, Cs=10*Ci micro-farad and 0.5*Cs=1 micro-farad, Vs=2 volt and Vi=0 volt) and $E_T$=5 joule before the switch is closed. After the switch is closed Vs=Vi=1.818 volt, $E_{USED}$=16.528+1.652=18.181 joules and $E_{LOST}$($E_T$−$E_{USED}$)=20−16.528=3.472 joules. Scenario 2 lost 1.363 joules more energy to heat and EMR while consuming 2.604 joules more energy. Thus the lower the operating voltage, the less power consumed and the less power is lost or wasted.

In a third scenario, Cs=10 micro-farads and there are three power islands with Ci1=Ci2=Ci3=1 micro-farad. Vs=4 volts before any switches are closed and Vi1=1.0 volt, Vi2=2 volts and Vi3=3 volts after corresponding switches are closed. There are three combinations of dispatching power to only one power island, 9 combinations of dispatching power to two power islands (including simultaneous and serial dispatch combinations) and 13 combinations of dispatching power to three power islands (including simultaneous, serial dispatch combinations and simultaneous/serial sub-combinations). As seen in TABLE II, the combinations that always waste the least amount of energy are simultaneous dispatching scenarios.

In a fourth scenario, Cs=10 micro-farads and there are three power islands with Ci1=1 micro-farad, Ci2=micro-farad and Ci3=3 micro-farad. Vs=4 volts before any switches are closed and Vi1=Vi2=Vi3=1 volts after corresponding switches are closed. Again, as seen in TABLE II, the combinations that always waste the least amount of energy are the simultaneous dispatching combinations.

TABLE II

| Dispatch Sequence | Scenario 3 Wasted Energy Joules | Scenario 4 Wasted Energy Joules |
|---|---|---|
| 1 | 13.38 | 2.53 |
| 2 | 11.88 | 4.34 |
| 3 | 9.38 | 5.64 |
| 1 and 2 | 21.94 | 5.64 |
| 2 then 1 | 22.86 | 5.95 |
| 1 then 2 | 22.86 | 5.95 |
| 1 and 3 | 19.44 | 6.56 |
| 3 then 1 | 20.36 | 6.93 |
| 1 then 3 | 20.36 | 6.93 |
| 2 and 3 | 17.94 | 7.21 |
| 2 then 3 | 18.86 | 7.8 |
| 3 then 2 | 18.86 | 7.8 |
| 1 and 2 and 3 | 25.66 | 7.65 |
| 2 and 3 then 1 | 27.09 | 8.06 |
| 1 then 2 and 3 | 27.09 | 8.06 |
| 2 then 1 and 3 | 27.09 | 8.29 |
| 1 and 3 then 2 | 27.09 | 8.29 |
| 1 and 2 then 3 | 27.09 | 8.36 |
| 3 then 1 and 2 | 27.09 | 8.36 |
| 3 then 1 then 2 | 27.84 | 8.55 |
| 3 then 2 than 1 | 27.84 | 8.55 |
| 2 then 3 then 1 | 27.84 | 8.55 |
| 1 then 2 then 3 | 27.84 | 8.55 |
| 2 then 1 then 3 | 27.84 | 8.55 |
| 1 then 3 then 2 | 27.84 | 8.55 |

Figure 4A:
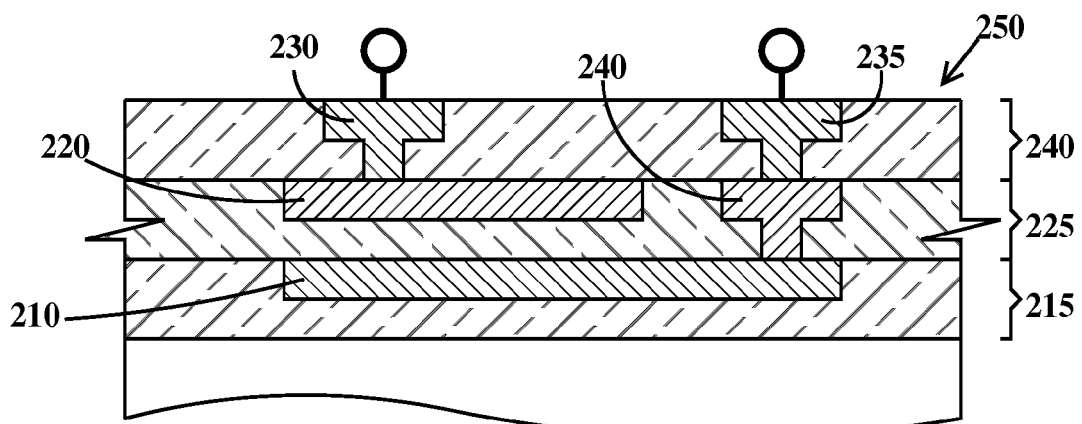
FIGS. 4A, 4B and 4C are exemplary cross-sectional diagrams of integrated circuit capacitors that may be utilized by the embodiments of the present invention.
Figure 4B:
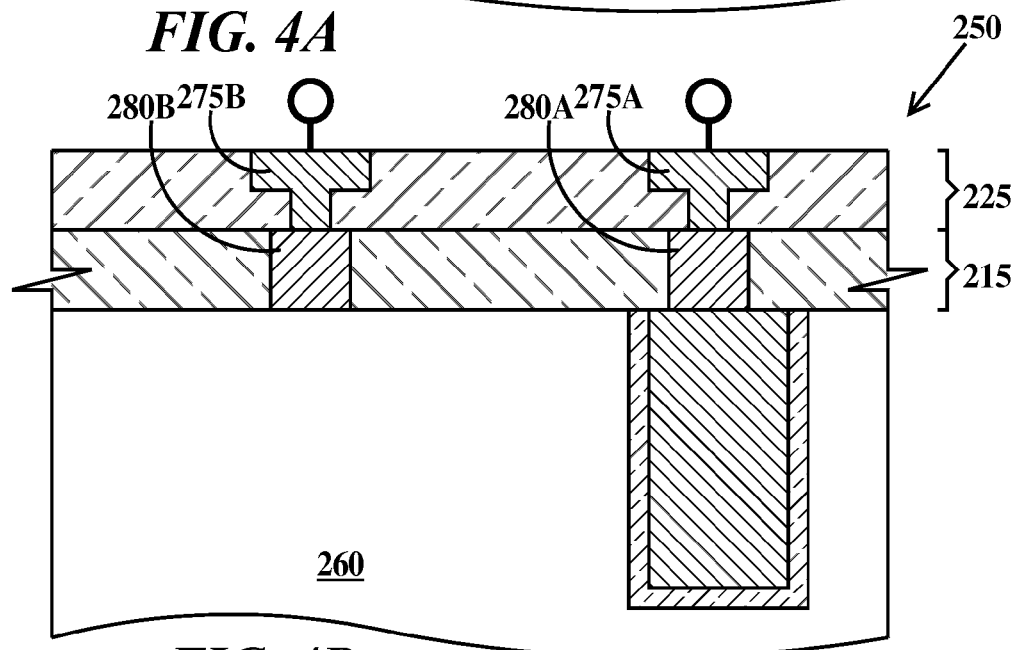
Figure 4C:
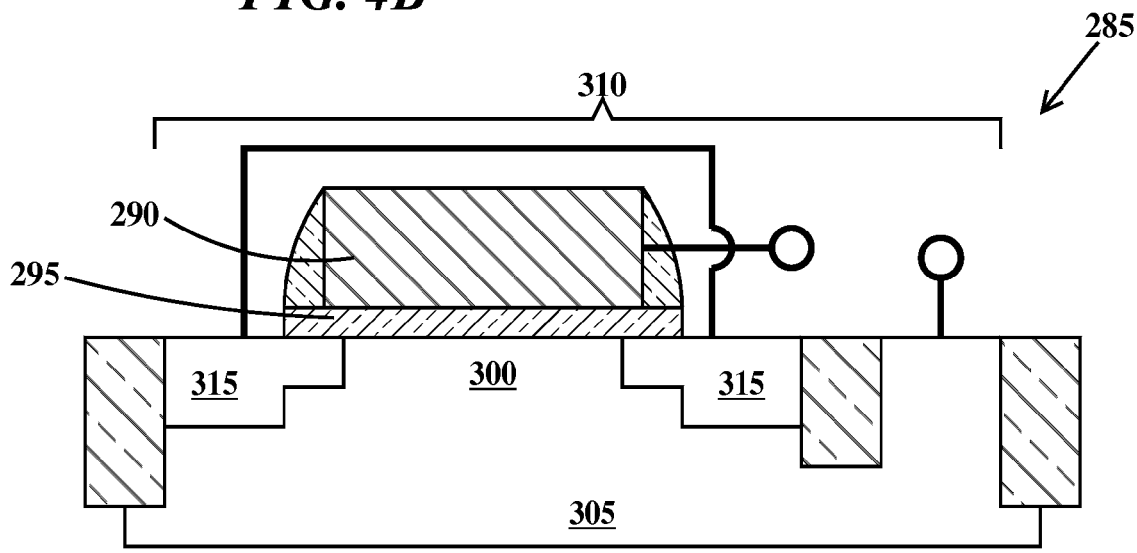

FIGS. 4A, 4B and 4C are exemplary cross-sectional diagrams of integrated circuit capacitors that may be utilized by the embodiments of the present invention. In FIG. 4A, a plate capacitor 200 includes a lower plate 210 formed in a first dielectric layer 215 and an upper plate 220 formed in a second dielectric layer 225, the second dielectric layer on top of the first dielectric layer. Electrical contact to upper plate 220 is made through a via 230 formed in a third dielectric layer 225 and electrical contact to lower plate 210 is made through a via 235 formed in a third dielectric layer 240 and a via 245 formed in second dielectric layer 225. The region of second dielectric layer 225 between lower and upper plates 210 and 220 is the capacitor dielectric of plate capacitor 200. Alternatively, the region of second dielectric layer 225 between lower and upper plates 210 and 220 can be removed and replaced by another dielectric layer of different thickness and/or composition.

In FIG. 4B, a trench capacitor 250 includes a trench 255 formed in a silicon substrate 260. The trench is lined with a dielectric layer and filled with polysilicon 270. Polysilicon 270 forms a first plate of the trench capacitor 250 and substrate 260 the second plate. Electrical contact to polysilicon 270 is made through a vias 275A and 280A formed in respective dielectric layers 225 and 215 and electrical contact to lower substrate 260 is made through vias 275B and 280B formed in respective dielectric layers 225 and 215.

In FIG. 4C, a gate capacitor 285 comprises a gate 290, gate dielectric 295 and channel 300 (in a silicon well 305) of a field effect transistor (FET) 310. Source/drains 315 of FET 310 are electrically shorted to each other. Gate 290 forms a first plate and well 305 forms a second plate of gate capacitor 285.

Figure 5A:
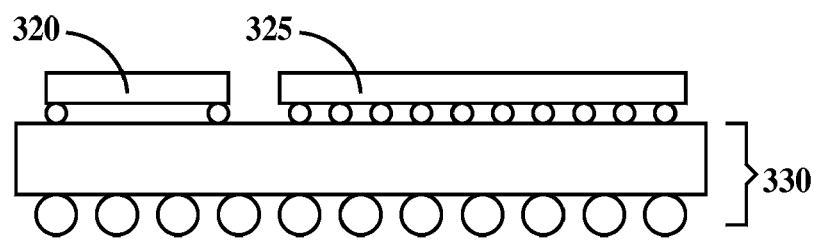
FIGS. 5A and 5B are alternative embodiments of the present invention.
Figure 5B:
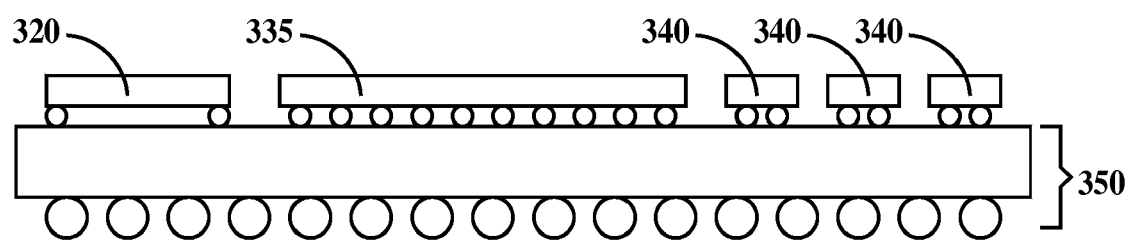

FIGS. 5A and 5B are alternative embodiments of the present invention. In FIG. 5A, a global storage capacitor 320 (CS of FIG. 1) and an integrated circuit chip 325 are mounted to a module 320, which electrically connects the global storage capacitor to the integrated circuit chip. Integrated circuit chip 325 includes all the structures illustrated in FIG. 1 and described supra except power supply 140 and global storage capacitor CS.

FIG. 5B, global storage capacitor 320 (CS of FIG. 1), an integrated circuit chip 335 and a multiplicity of local storage capacitors 340 (Ci1, Ci2 through CiN of FIG. 1) are mounted to a module 350 which electrically connects the global storage capacitor to the integrated circuit chip and the local storage capacitors. Integrated circuit chip 335 includes all the structures illustrated in FIG. 1 and described supra except power supply 140, global storage capacitor CS and local storage capacitors Ci1, Ci2 through CiN.

Thus, the embodiments of the present invention provide a method and electronic device architecture that reduces non-productive power consumption.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. An electronic device, comprising:
   one or more power islands, each power island including:
      a local storage capacitor coupling a local power grid to a local ground grid; and
      a functional circuit connected between said local power grid and said local ground grid;
   a global storage capacitor coupling a global power grid to a global ground grid, each local ground grid common to said global ground grid;
   one or more switches, each switch selectively connecting said global power grid to a single and different corresponding local power grid; and
   a power dispatch unit comprising;
      a power island "ready for power" sensor circuit coupling each of said one or more power islands to a power switch controller, said power switch controller adapted to independently open and close said one or more switches; and
      a voltage sensor circuit having inputs connected between said global power grid and said global ground grid and an output connected to said power switch controller.

2. The electronic device of claim 1, further including:
   a power dispatch data unit connected to said power switch controller.

3. The electronic device of claim 1, wherein each functional circuit includes an input latch, an output latch and logic circuits coupled between said input and output latches.

4. The electronic device of claim 3, wherein said island "ready for power" sensor is adapted to receive a power request signal from each of said one or more power islands.

5. The electronic device of claim 1, where said global storage capacitor and each local storage capacitor is independently selected from the group consisting of plate capacitors, trench capacitors and gate capacitors.

6. The electronic device of claim 1, wherein (i) said global storage capacitor, each power island and corresponding local storage capacitor, said power dispatch unit and each switch of said one or more switches are formed on a same integrated circuit chip, (ii) each power island and corresponding local storage capacitor, said power dispatch unit and each switch of said one or more switches are formed on said same integrated circuit chip and said global storage capacitor is not physically located on said same integrated circuit chip, or (iii) each power island except for each corresponding local storage capacitor, said power dispatch unit and each switch of said one or more switches is formed on said same integrated circuit chip and said global storage capacitor and each local storage capacitor is physically not located on said integrated circuit chip.

7. A method comprising:
   providing one or more power islands, each power island including:
      a local storage capacitor connected between a local power grid and a local ground grid; and
      a functional circuit connected between said local power grid and said local ground grid;
   providing a global storage capacitor coupling a global power grid to a global ground grid, each local ground grid connected to said global ground grid;
   providing one or more switches, each switch selectively connecting said global power grid to a single and different corresponding local power grid;
   providing a power dispatch unit adapted to open and close said one or more switches;
   providing said power dispatch unit with a power island "ready for power" sensor circuit and connecting said power island "ready for power" sensor circuit between each of said one or more power islands and a power switch controller, said power switch controller adapted to independently open and close said one or more switches; and
   providing said power dispatch unit with a voltage sensor circuit having inputs and an output and connecting said inputs between said global power grid and said global ground grid and connecting said output to said power switch controller.

8. The method of claim 7, further including:
   providing said power dispatch unit with a power dispatch data unit and connecting said power switch dispatch unit to said power switch controller.

9. The method of claim 7, wherein each functional circuit includes an input latch, an output latch and logic circuits coupled between said input and output latches.

10. The method of claim 9, wherein said power island "ready for power" sensor circuit is adapted to receive a power request signal from each of said one or more power islands.

11. The method of claim 7, where said global storage capacitor and each local storage capacitor is independently selected from the group consisting of plate capacitors, trench capacitors and gate capacitors.

12. The method of claim 7, further including: (i) forming said global storage capacitor, each power island and corresponding local storage capacitor, said power dispatch unit and each switch of said one or more switches on a same integrated circuit chip, (ii) forming each power island and corresponding local storage capacitor, said power dispatch unit and each switch of said one or more switches on said same integrated circuit chip and physically locating said global storage capacitor off said same integrated circuit chip, or (iii) forming said power islands except for each corresponding local storage capacitor, said power dispatch unit and each switch of said one or more switches on said same integrated circuit chip and physically locating said global storage capacitor and each local storage capacitor off said same integrated circuit chip.

13. A method comprising:

receiving one or more requests for power, each of said one or more requests for power from a single power island of one or more power islands, each power island including a local storage capacitor connected between a local power grid and a local ground grid and a functional circuit connected between said local power grid and said local ground grid; dispatching power stored in a global storage capacitor to one or more of said power islands that have requested power in response to said one or more requests for power by selectively connecting a global power grid and one or more of said local power grids, said global storage capacitor connected between a global power grid and a global ground grid, each local ground grid connected to said global ground grid; and dispatching power to power islands requesting power based on predetermined rules or power distribution algorithms.

14. The method of claim 13, further including:

said power distribution algorithms determining if power stored in said global storage capacitor is sufficient to satisfy all of said one or more requests for power.

15. The method of claim 13, wherein said rules include:

(i) if there is sufficient power stored in said global storage capacitor to satisfy all of said one or more requests for power, simultaneously dispatching power to all power islands requesting power;

(ii) if there is not sufficient power stored in said global storage capacitor to satisfy all of said one or more requests for power, selecting and simultaneously dispatching power to a combination of power islands requesting power in a manner that consumes the least amount of power;

(iii) if there is not sufficient power stored in said global storage capacitor to satisfy all of said one or more requests for power, selecting and simultaneously dispatching power to a combination of power islands that includes a maximum number of power islands; and (iv) if there is not sufficient power stored in said global storage capacitor to satisfy all of said one or more requests for power, selecting and dispatching power to a power island that has been requesting power for greater than a predetermined amount of time.

16. The method of claim 15, wherein an amount of power dispensed to a power island of said one or more power islands is determined by heat and electromagnetic power losses in a transmission line between said global storage capacitor and corresponding local storage capacitor of said one or more power islands.

17. The method of claim 13, wherein said dispatching power to a power island of said one or more power islands includes:

after selectively connecting said global power grid to said corresponding local power grid of said one or more power islands, transferring charge from said global storage capacitor to a corresponding local storage capacitor of said one or more power islands; and after transferring charge from said global storage capacitor to said corresponding local storage capacitor of said one or more power islands, selectively disconnecting said global power grid from said corresponding local power grid of said one or more power islands after a first voltage level across said global storage capacitor and a second voltage level across said corresponding local storage capacitor achieve a predetermined threshold value.

* * * * *